United States Patent [19]

Kawate et al.

[11] Patent Number: 4,505,024
[45] Date of Patent: Mar. 19, 1985

[54] METHOD OF MANUFACTURING SEMICONDUCTOR DEVICE, INCLUDING A STEP OF PATTERNING A CONDUCTOR LAYER

[75] Inventors: Keiichi Kawate, Ooita; Hiroshi Sekiya, Oonojo, both of Japan

[73] Assignee: Tokyo Shibaura Denki Kabushiki Kaisha, Kawasaki, Japan

[21] Appl. No.: 495,409

[22] Filed: May 17, 1983

[30] Foreign Application Priority Data

May 20, 1982 [JP] Japan .................................. 57-85215

[51] Int. Cl.³ ...................... H01L 21/22; H01L 21/31; H01L 21/28
[52] U.S. Cl. ......................................... 29/571; 29/578; 29/591; 148/1.5; 148/187; 357/23.1; 357/65
[58] Field of Search .................. 29/571, 576 B, 576 E, 29/578, 589, 591; 148/187, 1.5; 357/65, 69, 23

[56] References Cited

U.S. PATENT DOCUMENTS

| | | | |
|---|---|---|---|
| 4,338,138 | 7/1982 | Cavaliere et al. | 148/187 |
| 4,378,627 | 4/1983 | Jambotkar | 148/187 |
| 4,378,630 | 4/1983 | Horng et al. | 148/187 |

OTHER PUBLICATIONS

Hom-ma et al., "LSI Surface Leveling by RF Sputter Etching", J. Electrochem. Soc. 126, pp. 1531–1532, (1979).

Adams, et al., "Planarization of Phosphorus-Doped Silicon Dioxide", J. Electrochem. Soc., 128, pp. 423–429, 1981.

*Primary Examiner*—Brian E. Hearn
*Assistant Examiner*—David A. Hey
*Attorney, Agent, or Firm*—Finnegan, Henderson, Farabow, Garrett & Dunner

[57] ABSTRACT

A conductor layer is formed on an insulating film which is formed on a semiconductor substrate and which consists of a thick portion and a thin portion with a step therebetween. A film made of material having an etch rate substantially equal to that of the material of the conductor layer is formed on the layer. The film, which has a substantially flat upper surface, and the conductor layer form a laminated structure. Those portions of the laminated structure which are on the thin portion of the insulating film and said step have substantially the same thickness. A mask layer of a predetermined pattern is formed on the laminated structure. Using the mask layer, the laminated structure is selectively etched, the selected portions of the conductor layer and film being etched at the same etching rate. Thereafter, the mask layer and the remaining film are removed.

14 Claims, 21 Drawing Figures

METHOD OF MANUFACTURING SEMICONDUCTOR DEVICE, INCLUDING A STEP OF PATTERNING A CONDUCTOR LAYER

BACKGROUND OF THE INVENTION

The present invention relates to a method of manufacturing a semiconductor device including a step of patterning a conductor layer, which is particularly applicable to a MOS transistor and, more particularly, to a technique for patterning a conductor layer when a difference between the etching rates of the conductor layer to be etched and an underlying layer is not sufficiently large.

With a recent tendency toward greater miniaturization of semiconductor devices, anisotropic etching in which etching progresses substantially vertically with respect to the semiconductor wafer surface is widely adopted in the manufacture of semiconductors, as described in pp. 300–302 of "SEMICONDUCTOR HANDBOOK REVISED EDITION (1977)". Reactive ion etching is a typical anisotropic etching method, and is suitable for miniaturization. However, reactive ion etching does not assure a sufficient difference between the etch rates of a film to be etched and an underlying film.

FIGS. 1A to 1C are sectional views showing the steps of a method for manufacturing a MOS transistor with an Al gate by the conventional method.

Referring to FIG. 1A, a pair of n+-type regions 12 and 13 with a predetermined distance therebetween are formed in the surface layer of a p-type silicon semiconductor substrate 11. A thick silicon oxide film 14 about 5,000 to 6,000 Å thick is formed on the surface of the substrate 11 by the CVD (chemical vapour deposition) method. A thin silicon oxide film 16 for the gate having a thickness of about 700 Å is also formed on the substrate 11 by thermal oxidation. The element formation region of the substrate 11 is subjected to ion-implantation and annealing for control of the threshold voltage as needed. Contact holes 17 and 18 corresponding to the n+-type regions 12 and 13 are formed in the thick silicon oxide film 14.

A conductor layer 19 having thickness of about 6,000 to 7,000 Å and consisting of a mixture of 1% by weight of silicon and aluminum is formed on the thick and thin silicon oxide films 14 and 16. A resist film 20 of a redetermined thickness is formed on the conductor layer 19 and is patterned to have a predetermined shape.

Subsequently, the conductor layer 19 is selectively etched by reactive ion etching using the patterned resist film 20 as a mask, as shown in FIG. 1B, until the exposed portions of the conductor layer 19 are removed from the thin silicon oxide film 16.

Thereafter, the resist film 20 is removed. Using the gate structure formed on the thin silicon oxide film 16 as a mask, an n-type impurity is ion-implanted, as shown in FIG. 1C, to form n+-type regions 12' and 13' in self-alignment with the n+-type regions 12 and 13. Source and drain regions are thus formed.

In the manufacturing steps as described above, when the conductor layer 19 is formed as shown in FIG. 1A, a step is formed between the thick silicon oxide film 14 and the thin silicon oxide film 16. Then, when the conductor layer 19 is later etched, a corresponding step remains at the portion of the conductor layer 19 corresponding to this step. FIG. 2 is an enlarged sectional view of the gate region of the structure shown in FIG. 1A. When a thickness T1 of the portion of the conductor layer 19 which corresponds to the step is about 1.2 $\mu$m, the conductor layer 19 other than this portion will have a thickness T2 of 0.6 $\mu$m, which is half of T1. Then, the etching time of the conductor layer 19 must be long enough to completely etch the conductor layer 19 including the thick portion thereof.

If the etch rate of the conductor layer 19 is 1,000 Å/min, the etching time for completely removing the conductor layer 19 at the gate region is calculated to be 1.2 $\mu$m ÷ 1,000 Å/min = 12 minutes. However, since the thickness of the conductor layer 19 on the thin silicon oxide film 16 is 0.6 $\mu$m, which is half that at the step portion thereof, 12-minutes etching results in the etching of the underlying silicon oxide film 16 as well. If the etch rate of the thin silicon oxide film 16 is 10 times less than that of the conductor layer 19, the thickness of the film 16 is reduced by 600 Å. Furthermore, since the original thickness of the thin silicon oxide film 16 is 700 Å, overetching to allow a further margin results in almost no silicon oxide film 16 remaining, as shown in FIG. 1C. This significantly degrades the switching characteristics and reliability of the manufactured MOS transistor.

Meanwhile, methods have been proposed by Y. Homma et al., (J. Electrochem. Soc., 126, pp. 1531–1532 (1979)) and by A. C. Adams & C. D. Capio (J. Electrochem. Soc., 128, pp. 423–429 (1981)). According to these methods, an organic resist is coated on a wafer surface having a three-dimensional pattern, in order to provide a level surface. Thereafter, the wafer surface layer is etched under conditions such that the etch rates of the three-dimensional pattern and the resist film are the same, thereby allowing even or level etching of the wafer surface. However, these methods only allow level etching of the wafer surface and may not provide a solution to the problem of a decrease in the film thickness of the underlying film during etching of the desired film.

SUMMARY OF THE INVENTION

It is an object of the present invention to provide a method of manufacturing a semiconductor device, which allows complete etching of a film without thinning an underlying film even if the underlying film has a step.

According to an aspect of the present invention, there is provided a method of manufacturing a semiconductor device, including a step of forming a patterned conductor layer on an insulating layer which is formed on a semiconductor substrate and which has a thick portion and a thin portion with a step therebetween. The method further comprises step of: forming a conductor layer on said insulating layer; coating a material having an etching rate substantially equal to that of the material of said conductor layer on the conductor layer, forming a film which has a flat upper surface so that those portions of a laminated structure consisting of the conductor layer and the film which are on said thin portion and step of the insulating layer have the same thickness; forming a mask layer of a predetermined pattern on said film; and selectively etching the laminated structure, using the mask layer.

According to another aspect of the present invention, there is provided a method of manufacturing a semiconductor device, including a step of forming a patterned conductor layer formed on an insulating layer which is formed on a semiconductor substrate and which has a thick portion and a thin portion with a step therebetween. The method further comprises steps of: forming a conductor layer on said insulating layer, said conductor layer being so thick that a laminated structure consisting of the thin portion and that portion of the conductor layer which is on said thin portion has a substantially uniform thickness; forming a film having a flat upper surface on the conductor layer; removing a flat upper surface on the conductor layer; removing the film and an upper surface region of the conductor layer so that said conductor layer has an exposed flat upper surface laying above the thick portion; forming a mask layer; and selectively etching the conductor layer using the mask layer.

According to the method of the present invention, after a conductor layer is formed on an insulating film having a step, a film having a flat upper surface and made of a material having an etching rate substantially equal to that of the material of the conductor layer is formed on the conductor layer, thus forming a laminated structure. The laminated structure, which consists of the conductor layer and the film, has a flat upper surface though the underlying layer, i.e., the insulating layer has a step portion. A mask layer of a predetermined pattern is formed on the laminated structure. Using the mask layer, the laminated structure is selectively etched, the conductor layer and the film being etched at the same etching rate. By the method of the present invention, a decrease in the thickness of the underlying film during etching is thus prevented. Even if overetching of the conductor layer is performed, a decrease in the thickness of the underlying film is reduced to a minimum.

According to the method of the present invention, a thick conductor layer is formed on an insulating film having a step, so as to reduce indentation on its surface. Then, a substantially level film which can be etched at the same etch rate as that of the conductor layer is formed thereon. The conductor layer is then etched under conditions such that the etch rates of the conductor layer and the levelling film are the same. Thereafter, the conductor layer is selectively etched. Therefore, a decrease in the thickness of the thin portion of the underlying insulating film is prevented. Moreover, even if the conductor layer is overetched, a decrease in the thickness of the underlying film is smaller than in the conventional case.

DETAILED DESCRIPTION OF THE PREFERRED EMBODIMENTS

A method for manufacturing a semiconductor device according to an embodiment of the present invention will now be described with reference to the case of a MOS transistor with an Al gate.

Figure 1A:
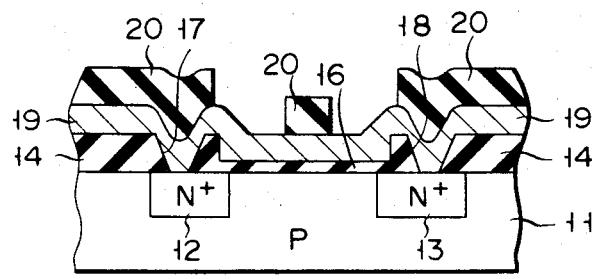
FIGS. 1A to 1C are sectional views showing steps of a conventional method for manufacturng a semiconductor device.
Figure 1B:
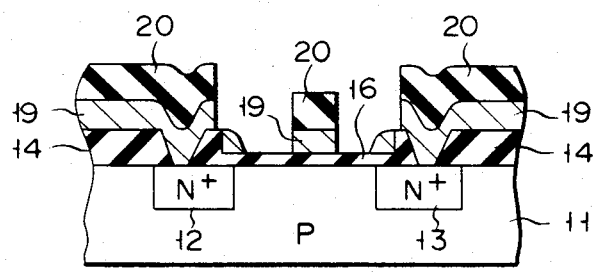
Figure 1C:
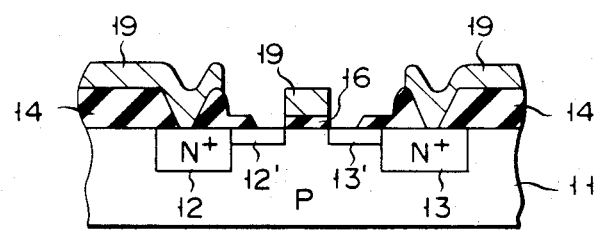
Figure 2:
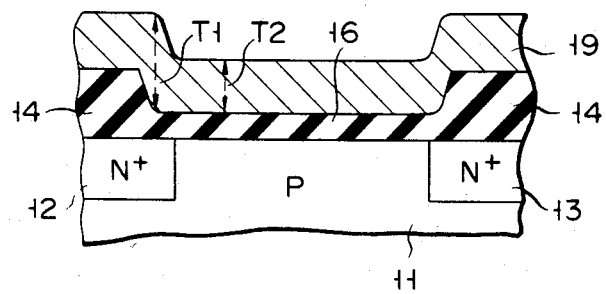
FIG. 2 is an enlarged sectional view of one step of the method shown in FIG. 1.
Figure 3A:
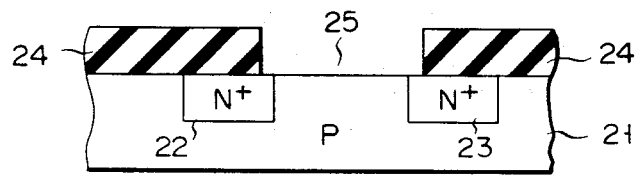
FIGS. 3A to 3I are sectional views showing steps of a method for manufacturing a semiconductor device according to an embodiment of the present invention.

First, as shown in FIG. 3A, a pair of n+-type regions 22 and 23 as parts of source and drain regions are formed a predetermined distance apart in a surface layer of a p-type silicon semiconductor substrate 21, in a similar manner to that of the conventional method. After removing a silicon oxide film formed on the surface of the substrate 21 during the preceding step, a thick silicon oxide film 24 about 5,000 to 6,000 Å thick is formed on the surface of the substrate 21 by the CVD method. Thereafter, an opening 25 is formed by the PEP technique in the part of the thick silicon oxide film 24 which corresponds to the element formation region.

Figure 3B:
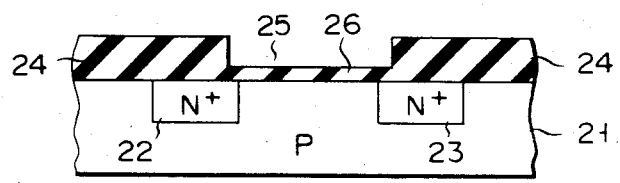

Subsequently, as shown in FIG. 3B, a thin silicon oxide film 26 for the gate and having a thickness of about 700 Å is formed by thermal oxidation on the surface of the substrate 21 exposed through the opening 25.

Figure 3C:
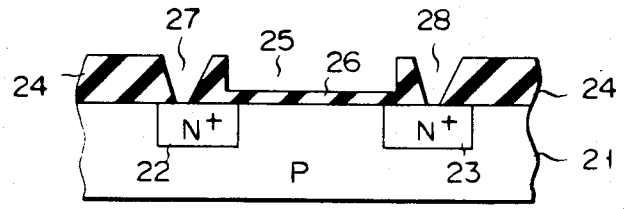

After performing ion-implantation and annealing for setting a threshold value as needed, contact holes 27 and 28 corresponding to the n+-type regions 22 and 23 are formed in the thick silicon oxide film 24 by the PEP technique, as shown in FIG. 3C.

Figure 3D:
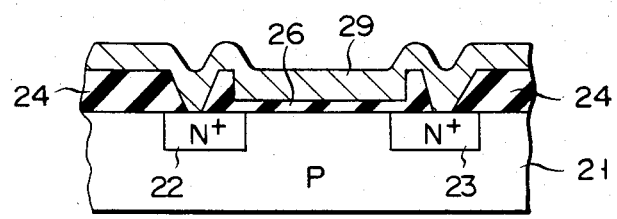

Then, as shown in FIG. 3D, a mixture of 1% by weight of silicon and aluminum is deposited on the entire surface of the structure, forming a conductor layer 29 having a thickness of about 6,000 to 7,000 Å.

Figure 3E:
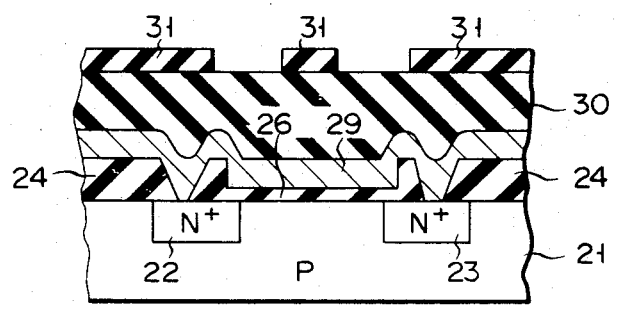

In the next step shown in FIG. 3E, a positive resist having a low viscosity (e.g., a positive resist "OFPR-800" of Tokyo Ohka Kogyo., Ltd.) is spin-coated using a spinner on the conductor layer 29 so as to form a substantially flat or level resist film 30. Silicon nitride ($Si_3N_4$) is deposited to a thickness of 300 to 500 Å on the entire surface of the film 30 by the plasma CVD method. The deposited silicon nitride is patterned to form a silicon nitride film 31.

Figure 3F:
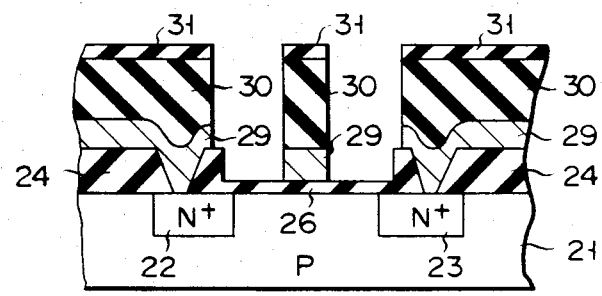

Finally, as shown in FIG. 3F, the resist film 30 and the conductor layer 29 are selectively etched by reactive ion etching using the silicon nitride film 31 as a mask. The reactive ion etching is performed under the conditions of a high-frequency power of 200 W, a flow rate ratio of $CCl_4$ to $Cl_2$ of 1.7:1 in an etching chamber, and a total pressure of 0.04 Torr (5.33 Pa (SI unit)) or lower and 0.11 Torr (14.66 Pa (SI unit)) or higher.

Figure 4:
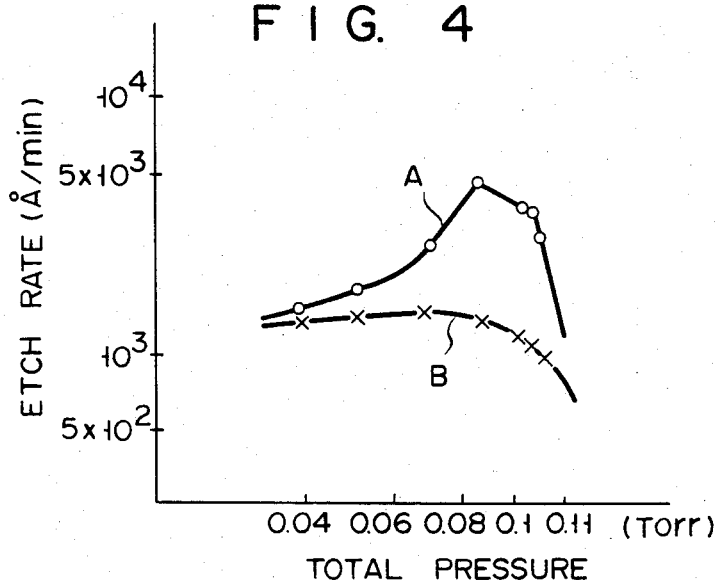
FIG. 4 is a graph for explaining the method shown in FIG. 3.

FIG. 4 is a graph showing etch rates (Å/min) of the conductor layer 29 and the resist film 30 as a function of total pressure (Torr) during reactive ion etching using a mixture of $CCl_4$ and $Cl_2$. The reactive ion etching was performed under the conditions of high-frequency power of 200 W, and a flow rate ratio of $CCl_4$ to $Cl_2$ of 1.7:1 in an etching chamber. The etch rate of the conductor layer 29, which is indicated by curve A, becomes substantially the same as the etch rate of the resist film 30, which is indicated by curve B, when the total pressure is either lower than 0.04 Torr or higher than 0.11 Torr.

Meanwhile, the flat resist film 30 is formed on the conductor layer 29 to have a substantially level surface. Therefore, the thickness of the laminated body of the conductor layer 29 and the resist film 30 at the step defined by the silicon oxide films 24 and 26 becomes substantially equal to that of the laminated body of the conductor layer 29 and the resist film 30 on portions of the silicon oxide film 26 other than the step portion.

For these two reasons, when the resist film 30 and the conductor layer 29 are selectively etched, etching of the two laminated bodies described above terminates nearly simultaneously. Thus, local overetching is not caused, and etching can be completed without decreasing the thickness of the thin silicon oxide film 26. It is noted that overetching of about 10% is preferably performed so as to prevent insufficient etching due to slight variations in film thickness. Assume that the laminated body of the conductor layer 29 and the resist film 30 is 1.2 μm, the etch rate of the laminated body of the conductor layer 29 and the resist film 30 is 1,000 Å/min, and the etch rate of the thin silicon oxide film 26 is 100 Å/min. Then, the decrease in the thickness of the thin silicon oxide film 26 can be calculated to be:

1.2 μm×(1/1,000 Å/min)×(1/10)×100 Å/min=120 Å

This decrease in film thickness is very small compared to the decrease of 600 Å in the conventional case.

Figure 3G:
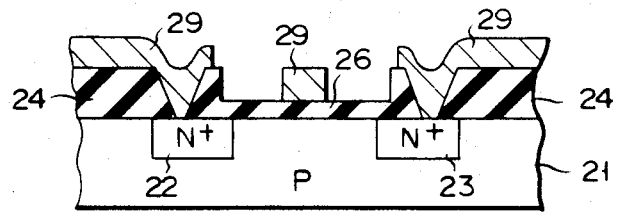

Then, as shown in FIG. 3G, the remaining silicon nitride film 31 and resist film 30 are removed by radiation with an $O_2$ plasma and with a resist separation liquid containing a chlorinated organic substance.

Figure 3H:
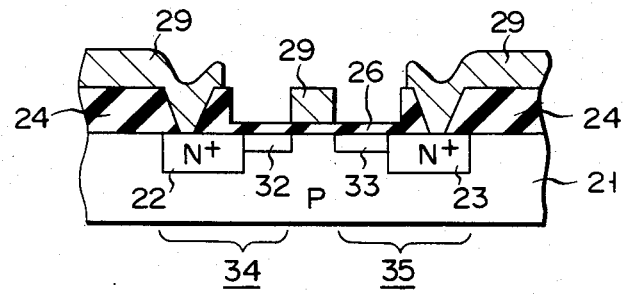
Figure 3I:
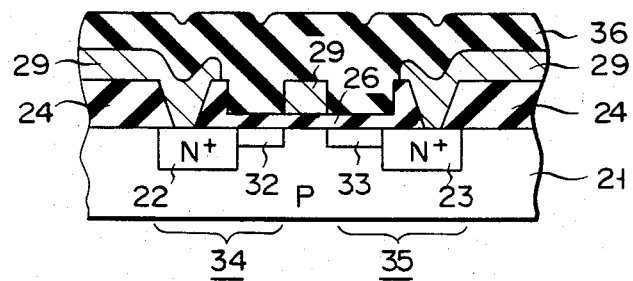

In the next step shown in FIG. 3H, using the conductor layer 29 which has been selectively etched to have a predetermined pattern as a mask, an n-type impurity is ion-implanted to form $n^+$-type regions 32 and 33 which are continuous with the $n^+$-type regions 22 and 23, respectively, thereby forming self-aligned source and drain regions 34 and 35.

After forming the source and drain regions 34 and 35 in this manner, a PSG protective film 36 is formed on the entire exposed surface portion of the semiconductor substrate 21, to complete manufacture of the MOS transistor.

According to the embodiment described above, the resist film 30 is formed on the conductor layer 29 to have a flat or level surface. Therefore, the thickness of the laminated body of the conductor layer 29 and the resist film 30 becomes the same at the step defined by the silicon oxide films 24 and 26, and on other portions of the silicon oxide film 26. Thereafter, the conductor layer 29 and the resist film 30 are etched under conditions such that their etch rates are the same. Therefore, a decrease in the thickness of the underlying film, i.e., the silicon oxide film 26, can be prevented during etching of the conductor layer 29. Even if overetching occurs or is performed, the decrease in the thickness of the underlying film can be reduced to the minimum.

A mask for etching the laminated body of the conductor layer 29 and the resist film 30 may consist of a material other than silicon nitride provided such a material can be coated by a coating means within a temperature range in which the underlying resist film 30 is not softened, and provided it has sufficient resistance to etching of the resist film 30. For example, a metal film of molybdenum or the like which is formed by sputtering, deposition or CVD, an aluminum silicon film formed by sputtering or deposition, a silicon oxide film formed by plasma CVD, or the like may be used.

A method for manufacturing a semiconductor device according to another embodiment of the present invention will now be described with reference to manufacture of a MOS transistor with an Al gate.

Figure 5A:
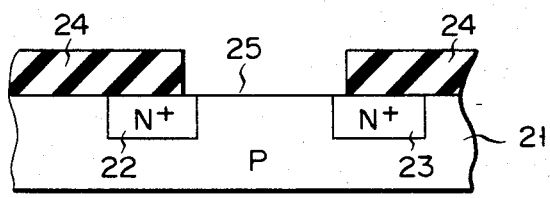
FIGS. 5A to 5G are sectional views showing steps of a method for manufacturing a semiconductor device according to another embodiment of the present invention.
Figure 5B:
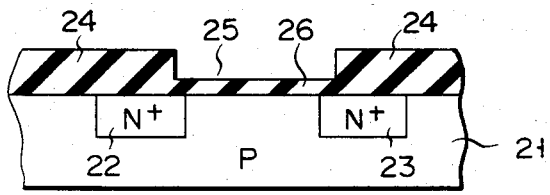
Figure 5C:
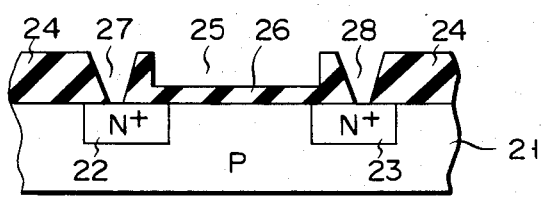

The respective steps shown in FIGS. 5A to 5C remain the same as those described with reference to FIG. 3, and will not be described.

Figure 5D:
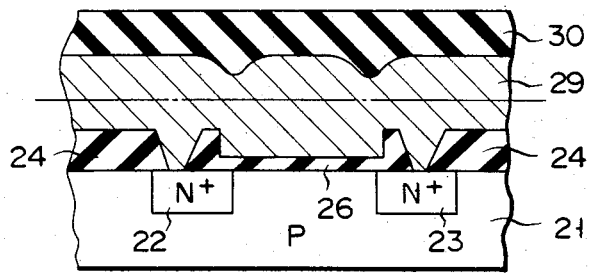

As in the case of the first embodiment, a mixture of 1% by weight of silicon and aluminum is deposited on the surface of the structure so as to form a conductor layer 29. As shown in FIG. 5D, in the case of the second embodiment, the conductor layer 29 is deposited to have a thickness of 1.2 μm or more, which is about twice that of the first embodiment. Thus, the surface of the conductor layer 29 has less indentation than that of the conductor layer 29 shown in FIG. 3D. A positive resist having a low viscosity is spin-coated to a thickness of about 1.5 μm using a spinner on the conductor layer 29 to form a resist film 30. The resist film 30 has a substantially flat or level surface.

The conductor layer 29 and the resist film 30 are etched by reactive ion etching to a point indicated by the alternate long and short dashed line in FIG. 5D under etching conditions such that their etch rates are substantially the same. Etching is terminated when the thickness of the conductor layer 29 on the thick silicon oxide film 24 is 6,000 to 7,000 Å. Since etching of the conductor layer 29 and the resist film 30 is performed such that their etch rates are the same, the surface of the conductor layer 29 after etching is substantially free of indentation.

Figure 5E:
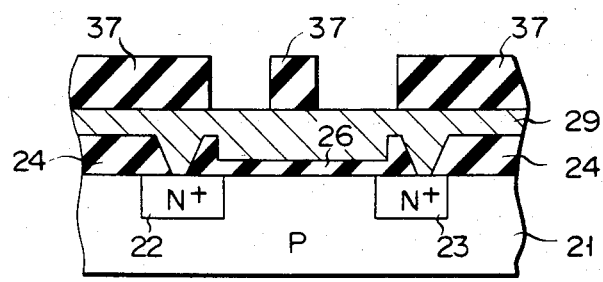

Next, as shown in FIG. 5E, a resist is spin-coated on the conductor layer 29 to form a resist film 37, which is then patterned.

Figure 5F:
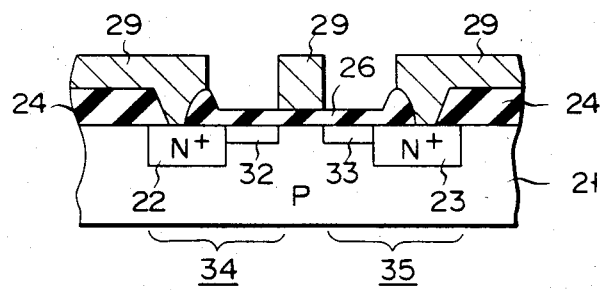
Figure 5G:
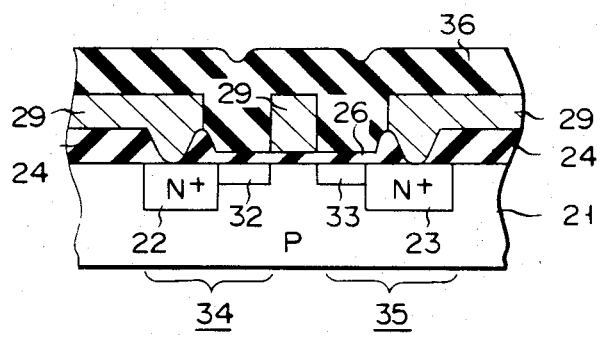

In the next step shown in FIG. 5F, using the patterned resist film 37 as a mask, the conductor layer 29 is selectively etched by reactive ion etching. During this etching step, the resist film 37 being used as a mask is also etched. The mask may alternatively be a mask consisting of silicon nitride or the like which is formed by plasma CVD, in place of the patterned resist film 37 described above.

Since the thickness of the conductor layer 29 at the step between the thick and thin silicon oxide films 24 and 26 and on the other portions of the silicon oxide film 26 is uniform, local overetching is not caused in any part of the conductor layer 29 during this etching step. Therefore, in the second embodiment, etching of the conductor layer 29 can be performed without causing a decrease in the thickness of the silicon oxide film 26. Thereafter, using the selectively etched conductor layer 29 as a mask, an n-type impurity is ion-implanted to form $n^+$-type regions 32 and 33 in the substrate 21 which are continuous with the $n^+$-type regions 22 and 23, respectively. Thus, source and drain regions 34 and 35 are formed in self-alignment.

After the source and drain regions 34 and 35 are formed in this manner, a PSG protective film 36 is formed on the entire exposed surface portion of the semiconductor substrate 21 by the CVD method, to complete manufacture of a MOS transistor.

According to the second embodiment of the present invention, a relatively thick conductor layer 29 is formed to have almost no indentations, on its surface and a resist film 30 is formed thereover, so that the resist film 30 has a level surface. Then, the conductor layer 29 is etched under etching conditions such that the etch rates of the conductor layer 29 and the resist film 30 are the same. Thereafter, using the patterned resist film 37 as a mask, the conductor layer 29 is again selectively etched. Therefore, the decrease in the thickness of the underlying thin silicon oxide film 26 may be reduced to the minimum. Even if overetching occurs or is performed, the decrease in the thickness of the underlying film may be reduced to the minimum, as in the case of the first embodiment.

The present invention is not limited to the particular embodiments described above. For example, in the step described with reference to FIG. 3E, the resist film 30 is formed on the conductor layer 29. However, any other film may be formed provided only that it has an etch rate substantially the same as that of the conductor layer 29.

Furthermore, in the above embodiments, reactive ion etching is performed to etch the conductor layer 29 or the laminated body of the conductor layer 29 and the resist film 30. However, etching may be performed by another anisotropic etching technique, such as plasma etching, which includes a physical etching action and which progresses extremely fast in the direction of thickness of the surface of the substrate in comparison with in the lateral direction. Etching may also be performed using a sputtering etching technique having a similar characteristic.

In the embodiments described above, the source and drain regions 34 and 35 consist of the first $n^+$-type regions 22 and 23 formed by diffusion of an impurity, and the second $n^+$-type regions 32 and 33 which are formed by a self-alignment technique using the patterned conductor layer 29 as a mask and which are continuous with the first $n^+$-type regions 22 and 23. However, the structure and the manufacturing steps of the MOS transistor are not limited to those described above. For example, source and drain regions may comprise single regions which are formed by diffusion of an impurity. Alternatively, source and drain regions may comprise regions which are formed by ion-implantation of an impurity using the patterned conductor layer 29 as a mask.

The above embodiments have also been described with reference to cases wherein the method of the present invention is applied to manufacture of a MOS transistor with an Al gate. However, it is to be understood that the present invention is similarly applicable to the manufacture of a MOS transistor with a polysilicon gate. Furthermore, the method of the present invention is not limited to the manufacture of MOS transistors of these types, but may be similarly applied to a variety of techniques for patterning conductor layers formed on thin insulating films with steps.

What we claim is:

1. A method of manufacturing a semiconductor device, including a step of forming a patterned conductor layer, comprising steps of:
    forming a conductor layer on an insulating layer which is formed on a semiconductor substrate and which has thick and thin portions with a step therebetween;
    coating a material having an etching rate substantially equal to that of the material of said conductor layer, thereby forming a film so that those portions of a laminated structure consisting of said conductor layer and said film which are on the thin portion of said insulating layer and said step have the same thickness;
    forming a mask layer of a predetermined pattern on said film; and
    selectively etching said laminated structure by using said mask layer to cause the surface of the thin portion of said insulating layer to be partially exposed.

2. A method of manufacturing a MOS transistor including a step of forming a patterned conductor layer, comprising steps of:
    forming a pair of impurity regions set apart at a predetermined distance in a surface region of a semiconductor substrate having a conductivity type opposite to said impurity regions;
    forming a thick insulating film on a surface portion of said semiconductor substrate other than a surface portion thereof which lies between said impurity regions;
    forming a thin insulating film on the surface portion of said semiconductor substrate which lies between said impurity regions, said thin insulating film forming a step with said thick insulating film;
    forming contact holes in said thick insulating film, thus exposing said impurity regions, respectively;
    forming a conductor layer on said thick insulating film and thin insulating film, thereby filling up said contact holes;
    coating a material having an etching rate substantially equal to that of the material of said conductor layer on said conductor layer, thereby forming a film which has a flat upper surface so that those portions of a laminated structure consisting of said conductor layer and said film which are on said thin insulating film and said step have the same thickness;
    forming a mask layer of a predetermined pattern on said film; and
    selectively etching said laminated structure by using said mask layer to cause the surface of said thin insulating film to be partially exposed, thereby forming a gate electrode on said thin insulating film.

3. A method of manufacturing a semiconductor device, including a step of forming a patterned conductor layer, comprising steps of:
    forming a conductor layer on an insulating film which is formed on a semiconductor substrate and which has a thick portion and a thin portion, said conductor layer being formed such that the upper surface portion thereof on the thin insulating film portion is made substantially equal to or greater than the upper surface portion of said conductor layer on the thick insulating film portion so as to make uniform the substantial thickness of said conductor layer which is defined on the thin insulating film portion;
    forming a film having a flat upper surface on said conductor layer;
    removing said film and an upper surface region of said conductor layer so that said conductor layer has an exposed flat upper surface lying above said thick portion;
    forming a mask layer of a predetermined pattern on said conductor layer; and
    selectively etching said conductor layer by using said mask layer to cause the surface of the thin portion of said insulating film to be partially exposed.

4. A method of manufacturing a MOS transistor including a step of forming a patterned layer, comprising steps of:
    forming a pair of impurity regions set apart at a predetermined distance in a surface region of a semiconductor substrate having a conductivity type opposite to said impurity regions;

forming a thick insulating film on a surface portion of said semiconductor substrate other than a surface portion which lies between said impurity regions;

forming a thin insulating film on the surface portion of said semiconductor substrate which lies between said impurity regions, said thin insulating film forming a step with said thick insulating film;

forming contact holes in said thick insulating film, thus exposing said impurity regions, respectively;

forming a conductor layer on said thick insulating film and thin insulating film, thereby filling up said contact holes, said conductor layer being so thick that a laminated structure consisting of said thin insulating film and that portion of said conductor layer which is on said thin insulating film has a substantially uniform thickness;

forming a film having a flat upper surface on said conductor layer;

removing said film and an upper surface region of said conductor layer so that said conductor layer has an exposed flat upper surface lying above said thick insulating film;

forming a mask layer of a predetermined pattern on said conductor layer; and selectively etching said conductor layer by using said mask layer to cause the surface of said thin insulating film to be partially exposed, thereby forming a gate electrode on said thin insulating film.

5. A method according to claim 1 or 2, wherein said film is a positive photoresist film.

6. A method according to claim 3 or 4, wherein said film is a positive photoresist film.

7. A method according to claim 1 or 2, wherein said film is formed on said conductor layer by spin-coating.

8. A method according to claim 3 or 4, wherein said film is formed on said conductor layer by spin-coating.

9. A method according to any one of claims 1 to 4, wherein said selective etching is anisotropic etching selected from the group consisting of ion etching, sputter etching and reactive ion etching, in which an etching rate in a lateral direction is low.

10. A method according to claim 3 or 4, wherein said step of removing the upper surface region of said conductor layer is anisotropic etching selected from the group consisting of ion etching, sputter etching and reactive ion etching, in which an etching rate in a lateral direction is extremely low.

11. A method according to claim 1 or 3, wherein said impurity regions are formed in predetermined portions of said semiconductor substrate, respectively.

12. A method according to any one of claims 1 to 4, wherein said mask layer is a silicon nitride film formed by plasma chemical vapor deposition.

13. A method according to any one of claims 1 to 4, further comprising a step of ion-implanting an impurity into the surface region of said semiconductor substrate using said conductor layer as a mask after said conductor layer is selectively etched.

14. A method according to any one of claims 1 to 4, further comprising a step of converting the exposed portions of said semiconductor substrate with a protective film after said conductor layer is selectively etched.

* * * * *